United States Patent [19]

Davis et al.

[11] Patent Number: 5,124,577

[45] Date of Patent: Jun. 23, 1992

[54] CIRCUIT FOR PRESETTING THE VOLTAGE OF AN OUTPUT TERMINAL

[75] Inventors: Harold L. Davis, The Colony; Douglas P. Sheppard, Southlake, both of Tex.

[73] Assignees: Benchmarq Microelectronics, Inc., Carrollton, Tex.; NEC Corporation, Tokyo, Japan

[21] Appl. No.: 590,476

[22] Filed: Sep. 28, 1990

[51] Int. Cl.[5] .............................. H03K 5/153
[52] U.S. Cl. .................... 307/359; 307/246; 307/555
[58] Field of Search ............... 307/246, 358, 359, 351, 307/549, 555

[56] References Cited

U.S. PATENT DOCUMENTS 4,906,867 3/1990 Petty ............................. 307/246 X
4,988,888 1/1991 Hirose et al. .................. 307/246 X

OTHER PUBLICATIONS

H. Okuyama, T. Nakano, S. Nishida, E. Aono, A. Satoh and S. Arita, "A 7.5 NS 32 K×9 CMOS SRAM", *IEEE Jossc.*, vol. 23, No. 5, Oct. 1988, pp. 1054–1059.

Primary Examiner—James B. Mullins
Attorney, Agent, or Firm—Ross, Howison, Clapp & Korn

[57] ABSTRACT

A circuit for presetting the voltage of an output terminal connected to an external load, where the output terminal receives either a high or a low voltage level state for output to the load during a data cycle, includes a voltage detector connected to the output terminal for sensing the voltage level at the output terminal at the end of the data cycle to determine whether the voltage level is at a high or a low voltage level state. A driver is connected to the voltage sensor for driving the voltage level at the output terminal prior to the start of a subsequent data cycle toward the opposite voltage state to a mid-level, as determined by the prior voltage state sensed by the voltage detector.

26 Claims, 3 Drawing Sheets

CIRCUIT FOR PRESETTING THE VOLTAGE OF AN OUTPUT TERMINAL

TECHNICAL FIELD OF THE INVENTION

The present invention relates to preset circuits, and more particularly to a circuit for actively driving the voltage level of an output terminal to a mid-level voltage.

BACKGROUND OF THE INVENTION

Typically, an output buffer will actively drive an output terminal either to a high voltage or to a low voltage state until data from a subsequent data cycle is available at the output buffer, at which time the output buffer will drive the output terminal with the new data. It is desirable that the output terminal be driven as quickly as possible to achieve the voltage level of the new data. Where the output terminal drives an external capacitive load, delay times are excessive especially in view of the speed of operation of the circuits generating the data to be applied to the output terminal. The rate at which the output load can be driven is generally difficult to increase by increasing the speed of the circuitry generating the data due to the capacitive and inductive nature of the load. Further, if the speed of operation of the circuit generating the data is increased, such operation causes increased noise levels on internal power supply lines.

A need has thus arisen for a circuit for actively driving the voltage of an output terminal to a mid-level voltage after old data is no longer needed and prior to the receipt by the output terminal of new data in order to reduce the voltage swing on the output terminal after the receipt of new data thereby reducing the delay time for the output terminal to reach the voltage level of the new data. A need has further arisen for a circuit for presetting the voltage of an output terminal in order to reduce the noise of the power supply during the time of output switching.

SUMMARY OF THE INVENTION

In accordance with the present invention, a circuit for presetting the voltage of an output terminal connected to an external load, where the output terminal receives either a high or a low voltage level state for output to the load during a data cycle is provided. The circuit includes a voltage detector connected to the output terminal for sensing the voltage level at the output terminal at the end of the data cycle to determine whether the voltage level is at a high or a low voltage level state. A driver is connected to the voltage detector for driving the voltage level at the output terminal prior to the start of a subsequent data cycle toward the opposite voltage state from the voltage state sensed by the voltage detector.

In accordance with another aspect of the present invention, a circuit for presetting the voltage of an output terminal connected to an external load, where the output terminal receives either a high or a low voltage level state for output to the load during a data cycle as provided. The circuit includes a voltage detector for sensing the voltage level at the output terminal at the end of a data cycle to determine whether the voltage level is at a high or a low voltage level state. A storage device is provided for storing the voltage level state sensed by the voltage detector. Circuitry is connected to the storing device for driving the voltage level at the output terminal prior to the start of a subsequent data cycle to a voltage level midway between the high and low voltage level states in a direction opposite to the level stored by the storage device.

In accordance with yet another aspect of the present invention, a circuit for presetting the voltage of an output terminal connected to an external load, where the output terminal receives either a high or a low voltage level state for output to a load during a data cycle is provided. The circuit includes a voltage detector connected to the output terminal for sensing the voltage level at the output terminal at the end of the data cycle. Circuitry is connected to the voltage detector for driving the voltage level at the output terminal prior to the start of a subsequent data cycle to within a range of predetermined voltage levels based upon the voltage at the output terminal sensed by the voltage detector. The voltage detector may include a plurality of voltage detectors for controlling the voltage range of the detectors or the rate at which the desired preset voltage level is achieved at the output terminal prior to the start of the subsequent data cycle.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
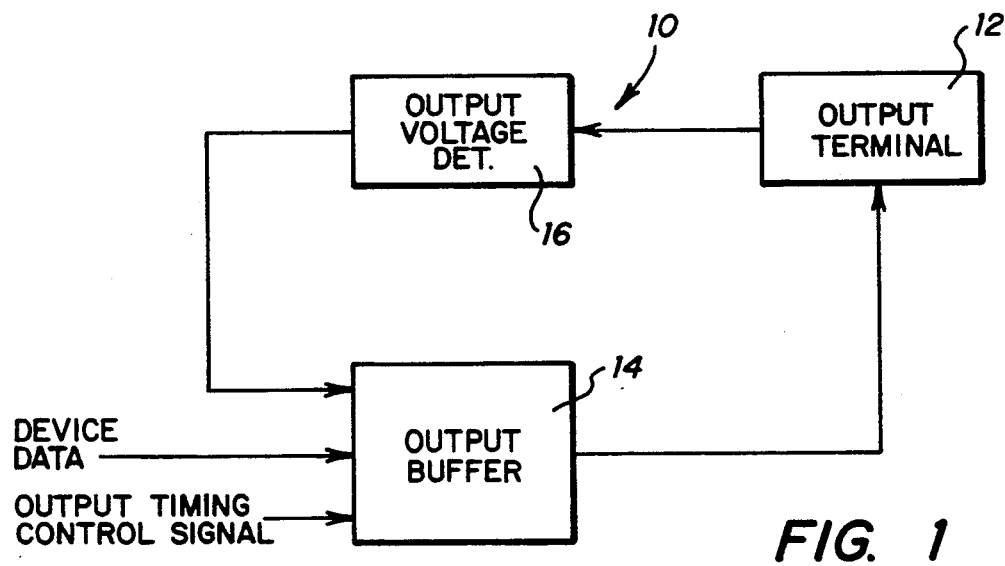
FIG. 1 is a block diagram of the present circuit for presetting the voltage of an output terminal.

Referring to FIG. 1, a circuit for presetting the voltage of an output terminal is illustrated, and is generally identified by the numeral 10. Circuit lo is utilized for presetting the voltage of an output terminal 12 which is driven by an output buffer 14. Output buffer 14 receives an input in the form of device data ranging between a high voltage level state and a low voltage level state for output to the output terminal 12. Output buffer 14 further receives an output timing control signal generated by the device generating the input data for controlling operation of output buffer 14.

At the start of a data cycle, output buffer 14 is activated by the output timing control signal in order to drive output terminal 12 to the voltage level state of the device data input by the device generating the data. Depending upon the sequence of the device data, output buffer 14 may be required to drive output terminal 12 over the full voltage swing from the high voltage level state to the low voltage level state during each cycle of the device data which results in long delays of outputs driving output terminal 12, especially where output terminal 12 is connected to an external capacitive load.

Circuit 10 of the present invention, includes an output voltage detector 16 interconnected to output terminal 12. Voltage detector 16 functions to detect the voltage level present at output terminal 12. The output of voltage detector 16 is applied to output buffer 14 in order to drive output buffer 14 prior to the beginning of a data cycle to preset the voltage level at output terminal 12 to a mid-level between the high voltage level state and the low voltage level state prior to commencement to a subsequent data cycle. In this manner, when the new device data is available at output buffer 14, the voltage level state of output terminal 12 need only travel approximately one-half of the normal voltage transition to produce the final output voltage state at output terminal 12, thereby the voltage level state at output terminal 12 is reached in less time as measured from the time device data became available to output buffer 14 than if a full voltage transition had occurred from the time device data was available to output buffer 14.

Output voltage detector 16 functions to drive the voltage level state at output terminal 12 low if the voltage sensed is high, and conversely, functions to drive the output voltage level at output terminal 12 high if the voltage level sensed is low. Output buffer 14 is inhibited from driving output terminal 12 with the device data until the presence of the output timing control signal which signals the start of a data cycle. Prior to the start of the data cycle, output buffer 14 is driven by output voltage detector 16 in order to preset the output voltage level at output terminal 12. Therefore, preset circuit 10 functions to drive output terminal 12 to a mid-level voltage state prior to the start of a subsequent data cycle by driving output buffer 14 based upon the previous state of the voltage level present at output terminal 12.

Figure 2:
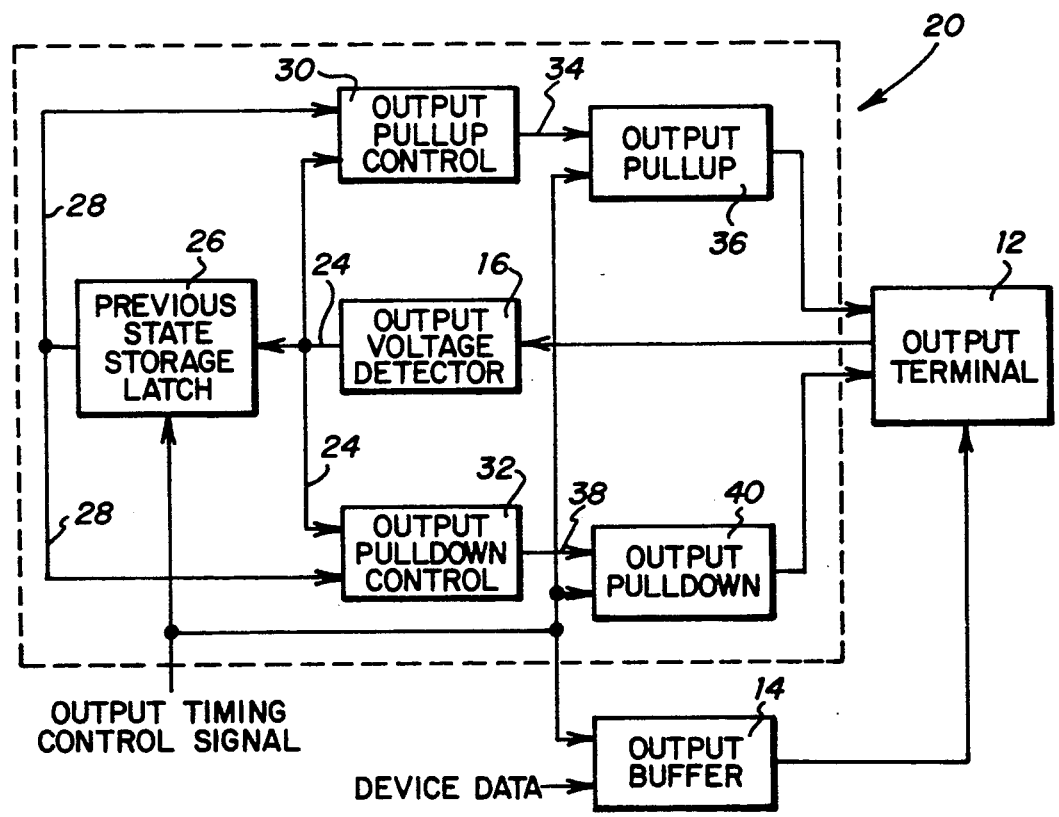
FIG. 2 is a block diagram of a further embodiment of the present circuit.

Referring now to FIG. 2, a further embodiment of the present circuit for presetting the voltage of an output terminal is illustrated, and is generally identified by the numeral 20. Circuit 20 drives an output terminal 12 which is driven through an output buffer 14 by device data as previously described with respect to FIG. 1. Circuit 20 includes output voltage detector 16 which continuously senses the output of output terminal 12. The output of output voltage detector 16 is applied along a signal line 24 to a previous state storage latch 26. Output voltage detector 16 has an input trip point such that if the voltage on output terminal 12 is above the trip point, output voltage detector 16 will have a particular output state on signal line 24. If the voltage on output terminal 12 is below the trip point, the output voltage detector 16 will have an opposite output state applied on signal line 24. Previous state storage latch 26 is a latch which has the ability, depending upon the state of output timing control signal which is applied to latch 26, to either sample the information on signal line 24 and pass that information to its output at signal line 28 or to store the information on signal line 28 and ignore the voltage level present on signal line 24.

The output of latch 26 applied via signal line 28 is applied to an output pullup control circuit 30 and an output pulldown control circuit 32. Output pullup control circuit 30 and output pulldown control circuit 32 further receive the output voltage of detector 16 via a signal line 24. Output pullup control circuit 30 combines the signals on signal lines 24 and 28 to determine whether an output should be generated via a signal line 34 to an output pullup circuit 36. Similarly, output pulldown control circuit 32 operates to combine the signals present on signal lines 24 and 28 to generate an output via a signal line 38 to an output pulldown circuit 40. Output pullup circuit 3 and output pulldown circuit 40 provide inputs to output terminal 12 depending upon which of these circuits is activated. Output pullup circuit 36 and output pulldown circuit 40 drive output terminal 12 either higher or lower, depending upon the information on signal lines 34 and 38 and the presence or absence of the output timing control signal.

In the operation of the circuit 20, output voltage detector 16 constantly monitors the voltage of output terminal 12 irrespective of the actions or states of the other components of circuit 20. Output terminal 12 will have a variable analog voltage in one of two regions. Region 1 is above the trip point of output voltage detector 16, and region 2 is below that trip point. The output of output voltage detector 16 on signal line 24 has two states. If the output terminal 12 voltage is in region 1, the output of output voltage detector 16 will be state 1. If the voltage at output terminal 12 is in region 2, the voltage output by output voltage detector 16 on signal line 24 will be state 2.

The output timing control signal operates between two states. In state 1, either of three events occur. A first event is that latch 26 passes data from signal line 24 to signal line 28. A second event while output timing control signal is in state 1 is that output buffer 14 drives output terminal 12 with device data. And a third event occurring in state 1 of output timing control signal is that output pullup circuit 36 and output pulldown circuit 40 are inhibited from driving output terminal 12. State 1 of output timing control signal corresponds to the old or previously active cycle of the device.

As the device enters a new active cycle, and after some inherent delay, the output timing control signal changes from state 1 to state 2, and will be maintained in state 2 for some period of time, but not longer than the time for the actual device data to be available at output buffer 14. This transition designates the end of the present data cycle. On the transition of output timing control signal from state 1 to state 2, three events occur. The first event is that the information on signal line 24 is latched and stored by latch 26. The second event is that output buffer 14 is inhibited from driving output terminal 12, and the third event is that either output pullup circuit 36 or output pulldown circuit 40 will drive output terminal 12 to a mid-level voltage from the previous level driven by the device data.

The state of the voltage level on signal line 24 determines whether output pullup circuit 36 or output pulldown circuit 40 will drive output terminal 12. Only one circuit 36 or 40 may be activated during the time that output timing control signal is in state 2. Output terminal 12 will be driven towards the mid-level voltage until one of two events occurs. The first event is that the voltage on output terminal 12 passes through the trip point of output voltage detector 16 thereby disabling output pullup circuit 36 or output pulldown circuit 40. The second event is that output timing control signal changes back to state 1.

When actual device data is available to output buffer 14, output timing control signal returns to state 1 thereby enabling output buffer 14 to drive output terminal 12 from the mid-level voltage established by circuit 20 to the final voltage of the device data. This event is the start of the subsequent data cycle. Output pullup circuit 36 and output pulldown circuit 40 are again inhibited from driving output terminal !2, and the data on signal line 24 is again able to pass onto signal line 28 through latch 26 in order to precondition output pullup control 30 and output pulldown control 32 to a high or low value depending upon the device data of the present cycle.

The operation of latch 26 allows the storage of the previous output terminal 12 voltage level to thereby drive the voltage level on output terminal 12 in only one direction. Without the storage of this previous voltage level of output terminal 12, and the disabling of either output pullup circuit 36 or output pulldown circuit 40 through the signal generated by latch 26 on signal line 28, the preset voltage on output terminal 12 would oscillate above and below the mid-level voltage level because output terminal 12 would be alternatively driven high and low as the preset voltage repeatedly crossed the trip point of output voltage detector 16.

The presetting of the voltage on output terminal 12 by circuit 20 is terminated as described above when output voltage detector reaches its trip point. Additionally, circuit 20 is prevented from establishing the mid-level voltage on output terminal 12 when output timing control signal changes state to indicate that new data is available. New device data being available at output buffer 14 will drive output terminal 12 regardless of the voltage level established by circuit 20. New device data may be available at output buffer 14 prior to the mid-level voltage level being achieved by circuit 20 in the event of, for example, a large amount of capacitance at output terminal 12 and circuit 20 is only able to move the voltage level at output terminal 12 very slowly during which time new device data is available at output buffer 14.

Figure 3:
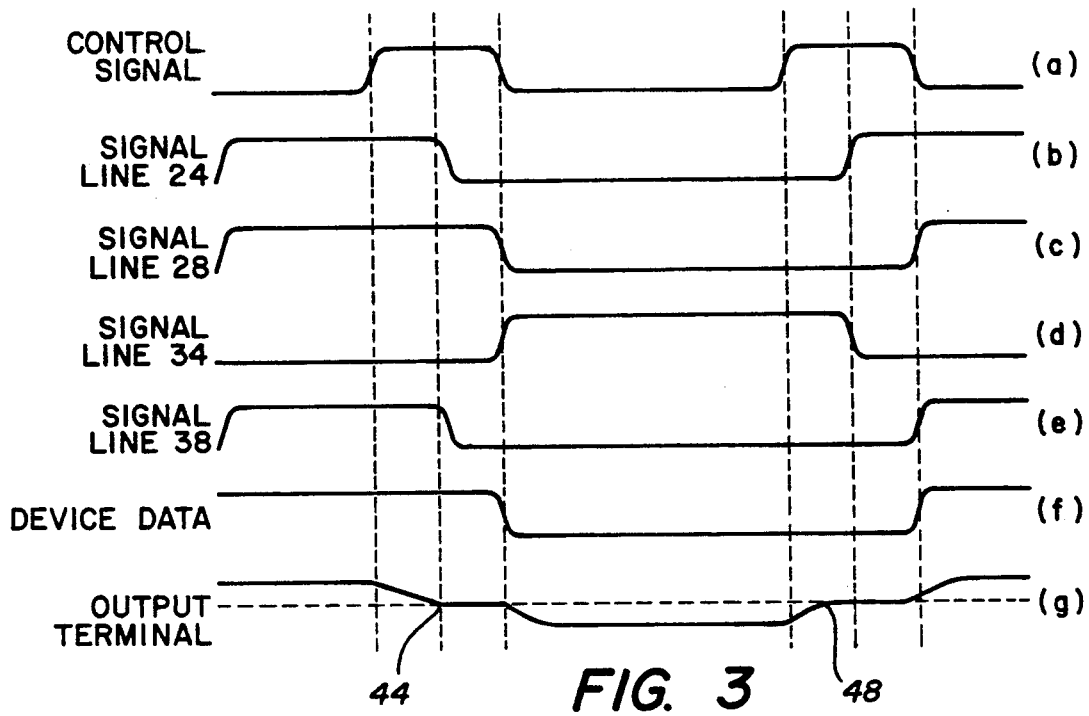
FIG. 3 is a voltage waveform timing diagram illustrating the operation of the circuit of FIG. 2.

To further illustrate the operation of the present preset circuit 20 of FIG. 2, reference is now made to the timing diagram of FIG. 3. Initially, assume that the voltage level on output terminal 12 was high (FIG. 3g). Output timing control signal (FIG. 3a) is at state 1 (low) at the end of an active cycle and moves to state 2 (high) at the beginning of an active cycle to activate circuit 20. This event also marks the end of the data cycle. The state of output terminal 12 being high causes output voltage detector 16 to detect that high voltage level and output this high level on signal line 24 (FIG. 3b). This high value is passed by latch 26 to signal line 28 (FIG. 3c). Therefore, the high voltage level state at output terminal 12 is reflected by high voltage levels at signal lines 24 and 28.

As output timing control signal changes to state 2 at the end of the data cycle, the voltage level at signal line 28 is latched and no longer responds to the voltage level on signal line 24. The output timing control signal changing to state 2 also enables output pullup control circuit 30 and output pulldown control circuit 32. Since the voltage level on signal line 28 is high and the voltage level at signal line 24 is high, the output pullup circuit 36 is disabled (FIG. 3d) and output pulldown circuit 40 is enabled, signal line 38 being high (FIG. 3e). With the signal on signal line 24 remaining high, output pullup circuit 36 is disabled and output pulldown circuit 40 is enabled thereby decreasing the voltage level at output pin 12.

As a voltage level of output terminal 12 goes from the previous high level to a mid-level voltage at reference numeral 44, the voltage level passes the trip point of output voltage detector 16 and the voltage level on signal line 24 goes low. The voltage level on signal line 28 is maintained high by latch 26, and therefore output pulldown control circuit 32 is disabled to terminate the operation of output pulldown circuit 40. The voltage level at signal line 38 going low disables output pulldown circuit 40. The voltage level at output terminal 12 remains at the mid-level voltage until output timing control signal returns to its original state, signifying the start of the new data cycle and allowing device data to drive output buffer 14 and output terminal 12. Output timing control signal also disables output pullup circuit 36 and output pulldown circuit 40. The device data then as illustrated in FIG. 3f goes low to drive output terminal 12 low.

Still referring to FIG. 3, had the original state of output terminal 12 voltage level been low, the output of output voltage detector 16 would have a low voltage level on signal line 24 resulting in a low voltage level on signal line 28. With both signal lines 24 and 28 being low, the output of output pullup control 30 on signal line 34 would be high thereby enabling output pullup circuit 36. Output pulldown circuit 40 would be disabled due to a low on signal line 38 generated by output pulldown control circuit 32. Output pullup circuit 36 being activated causes the voltage on output terminal 12 to increase to the level illustrated at reference number 48 on FIG. 3g until the output timing control signal returns to state 1 and device data is available to output buffer 14.

Figure 4:
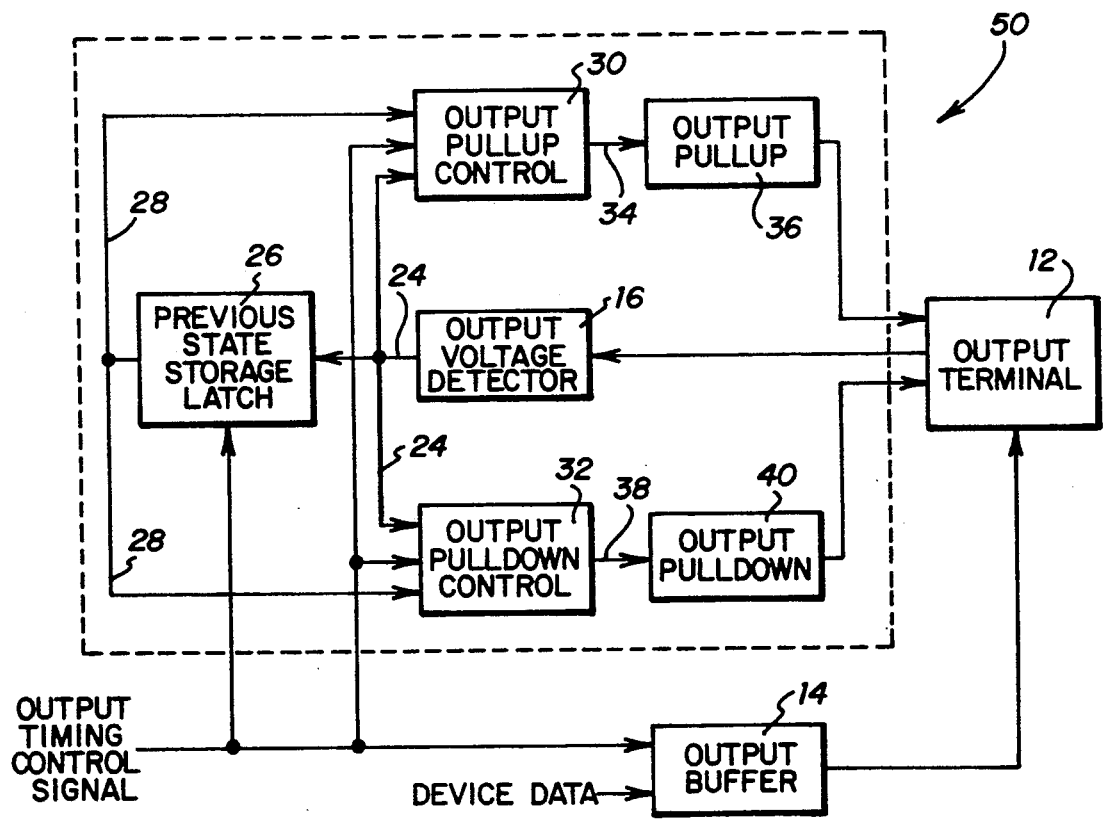
FIG. 4 is a block diagram of a further embodiment of the present circuit.

Referring now to FIG. 4, a further embodiment of the preset circuit 20 (FIG. 2) is illustrated, and is generally identified by the numeral 50. Preset circuit 50 operates in a manner similar to preset circuit 20, however, output timing control signal is applied to output pullup control circuit 30 and output pulldown control circuit 32 instead of being applied to output pullup circuit 36 and output pulldown circuit 40 as illustrated in FIG. 2. Output pullup control circuit 30 and output pulldown circuit 32 function to combine the state of output timing control signal with the voltage levels on signal lines 24 and 28 in order to actuate output pullup circuit 36 or output pulldown circuit 40, respectively.

Figure 5:
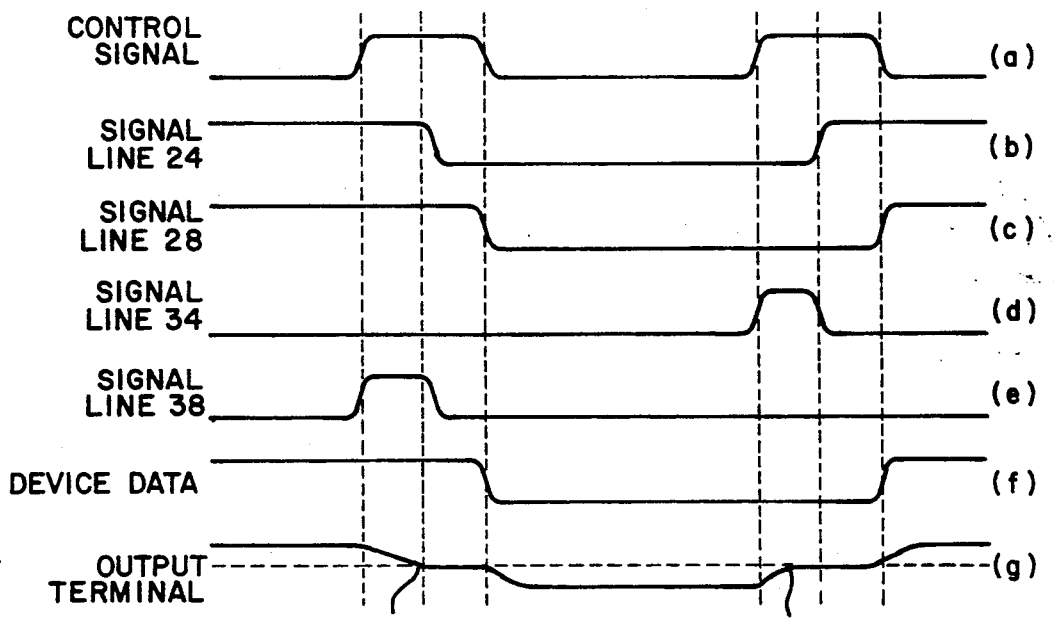
FIG. 5 is a voltage waveform timing diagram illustrating the operation of the circuit of FIG. 4.

FIG. 5 illustrates the differences in operation between preset circuit 20 and preset circuit 50, particularly in the output voltage levels on signal lines 34 and 38. The output present on signal line 38 is high when the output timing control signal is in state 2, otherwise the operation of present circuit 50 corresponds to the operation of preset circuit 20 and is described with respect to FIG. 3.

Figure 6:
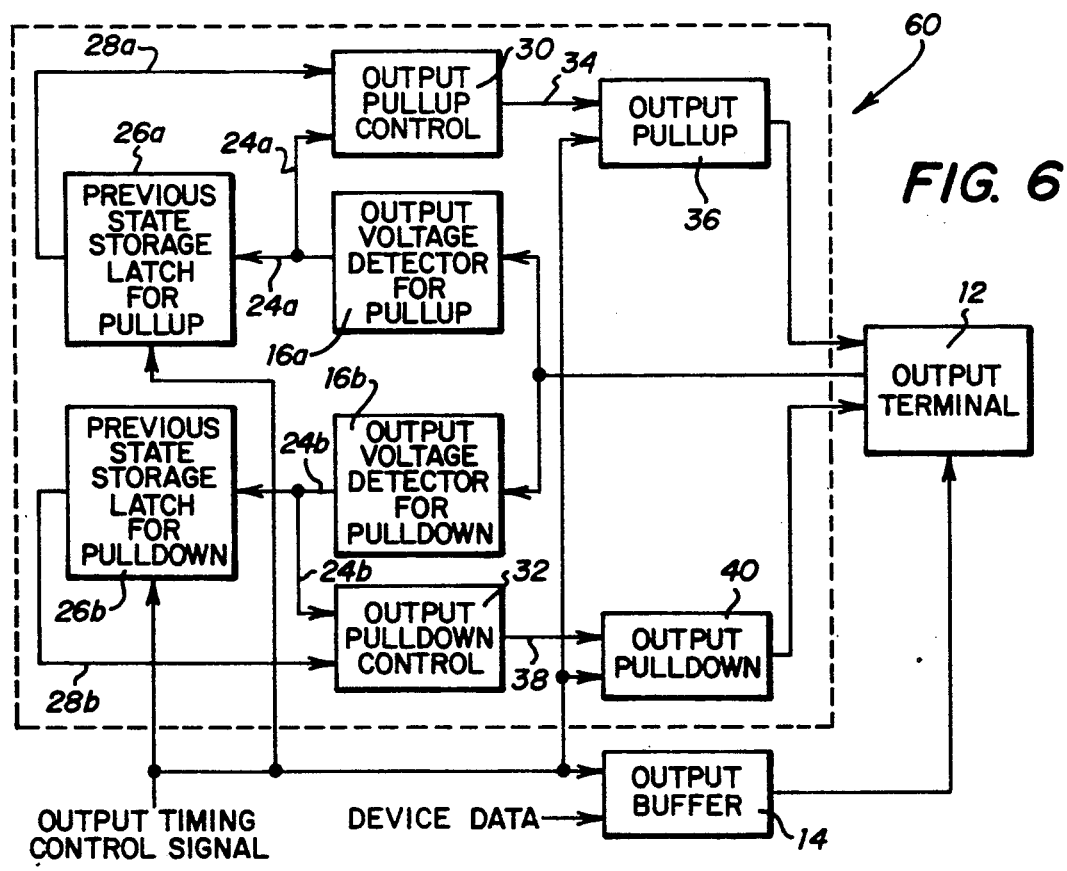
FIG. 6 is a block diagram of a further embodiment of the present circuit.

Referring now to FIG. 6, a further embodiment of the present preset circuit is illustrated, and is generally identified by the numeral 60. Like numerals are utilized for like and corresponding components previously identified with respect to FIG. 2 and preset circuit 20. Preset circuit 60 includes two output voltage detectors, 16a and 16b and two latches 26a and 26b to provide for two separate detector trip points to be utilized instead of a single trip point as illustrated in FIG. 2 with respect to preset circuit 20. The trip point of output voltage detector 16a may be lower than the trip point of output voltage detector 16b to provide for three possible voltage levels for output terminal 12 instead of two levels with respect to preset circuit 20. The output voltage present on output terminal 12 may be in a region 1 if its voltage is above the trip point of both output voltage detector 16a and output voltage detector 16b. The output voltage of output terminal 12 may be in a region 2 if its voltage is below the trip point of both output voltage detector 16a and output voltage detector 16b. Finally, the output voltage of output terminal 12 may be in a region 3 if its voltage is above the trip point of output voltage detector 16a but below the trip point of output voltage detector 16b.

Preset circuit 60 provides better control in driving output terminal 12 to a mid-level voltage level state since there is some inherent delay associated with the operation of output voltage detector 16 (FIG. 2) because there is not immediate disabling of output pullup circuit 36 or output pulldown circuit 40 as output terminal 12 is driven past the trip point of the voltage detector 16. Because of this delay, the voltage of output terminal 12 passes through the actual mid-level voltage. The use of output voltage detector 16b set higher than the mid-level trip point and output voltage detector 16a being set lower than the mid-level trip point allows for the slight inherent delay to preset the voltage level state of output terminal 12 closer to the desired mid-level voltage.

Additionally, preset circuit 60 allows for disabling both output pullup circuit 36 and output pulldown circuit 40 in the event that the output voltage state of output terminal 12 is in the region 3 described between the two trip points of output voltage detectors 16a and 16b. Therefore, the voltage level state of output terminal 12 if already near the desired mid-level voltage is not predriven by preset circuit 60. The separation of output voltage detector 16 into two independent detectors 16a and 16b also provides for independent control of the rate at which the output voltage of output terminal 12 may be driven toward the mid-level voltage thereby creating a variable pulldown or pullup rate which would be a function of the region in which the voltage level of output terminal 12 started. Additional intermediate levels may be detected to further enhance the control of a variable pulldown or pullup rate.

It therefore can be seen that the present circuit for presetting the voltage of an output terminal functions to actively drive the output of an output terminal to a mid-level voltage prior to new data being available at an output buffer thereby allowing the output terminal voltage to reach its final state in less time. The preent circuit further functions to reduce the noise of the power supply during the time of output switching.

Whereas the present invention has been described with respect to specific embodiments thereof, it will be understood that various changes and modifications will be suggested to one skilled in the art and it is intended to encompass such changes and modifications as fall within the scope of the appended claims.

We claim:

1. A circuit for presetting the voltage of an output terminal connected to a load, where the output terminal receives either a high or a low voltage level state for output to the load during a data cycle, the circuit comprising:

a detect circuit connected to the output terminal for sensing the voltage level at the output terminal at the end of the data cycle to determine whether the voltage level is at a high or a low voltage level state;

a driving device connected to said sensing means for driving the voltage level at the output terminal prior to the start of a subsequent data cycle to substantially a predetermined voltage between the high and low voltage level states and from substantially only one of the high and low voltage level states; and said driving device including a drive inhibition device for substantially stopping the driving operation of said driving device when the voltage level at the output terminal is substantially equal to said predetermined voltage.

2. The circuit of claim 1 wherein said predetermined voltage is a mid-voltage level midway between the high and the low voltage level states.

3. The circuit of claim 1 and further including:

a controller for controlling said driving device to operate in a first mode and a second mode, said modes mutually exclusive, operation in said first mode for only increasing the voltage level at the output terminal to substantially a mid-voltage level midway between the high and the low voltage level states, and operation in said second mode for only decreasing the voltage level at the output terminal to substantially a mid-voltage level midway between the high and the low voltage level states.

4. The circuit of claim 1 and further including:

a controller for controlling said driving device for preventing said driving device from driving the voltage level at the output terminal repeatedly greater than or less than substantially a mid-voltage level midway between the high and the low voltage level states, said predetermined voltage equal to the mid-voltage level.

5. The circuit of claim 1 and further including:

a controller for controlling said driving device for driving the voltage level at the output terminal to within a predetermined voltage range of said predetermined voltage, said predetermined voltage equal to the voltage level midway between the high and the low voltage level states.

6. The circuit of claim 1 and further including:

a controller for controlling said driving device for controlling the rate at which the voltage level at the output terminal is driven to substantially said predetermined voltage, said predetermined voltage equal to a voltage level midway between the high and the low voltage level states.

7. The circuit of claim 6 wherein the rate is determined by the relative voltage difference between the actual voltage level at the output terminal and the voltage level midway between the high and the low voltage level states.

8. A circuit for presetting the voltage of an output terminal connected to an external load, where the output terminal receives either a high or a low voltage level state for output to the load during a data cycle, the circuit comprising:

a detect device connected to the output terminal for sensing the voltage level at the output terminal at the end of the data cycle to determine whether the voltage level is at a high or a low voltage level state;

a storage device for storing the voltage level state sensed by said detect device;

a driving device connected to said storage device for driving the voltage level at the output terminal prior to the start of a subsequent data cycle to substantially a mid-voltage level midway between the high and the low voltage level state in a direction opposite to the level stored by said storage device and from substantially only the opposite one of the high or low voltage level states stored in said storage device; and said driving device including a drive inhibition device for stopping the driving operation of said driving device when the voltage level at the output terminal is substantially equal to said mid-voltage level.

9. The circuit of claim 8 wherein said driving device operates in a first mode and a second mode, said modes mutually exclusive, said driving device operable in said first mode to only increase the voltage level at the output terminal to the mid-voltage level, and operable in said second mode to only decrease the voltage level at the output terminal to the mid-voltage level.

10. The circuit of claim 9 and further including:
a controller for controlling said driving device for preventing said driving device from driving the voltage level at the output terminal repeatedly greater than the mid-voltage level during the first mode of operation and less than the mid-voltage level in the second mode of operation.

11. The circuit of claim 8 and further including:
a controller for controlling said driving device for driving the voltage level to within a predetermined voltage range of said mid-voltage level.

12. The circuit of claim 8 and further including:
a controller for controlling said driving device for controlling the rate at which the voltage level at the output terminal is driven towards said mid-voltage level.

13. The circuit of claim 12 wherein the rate is determined by the relative voltage difference between the actual voltage level at the output terminal and the mid-voltage level.

14. A circuit for presetting the voltage of an output terminal connected to a load, where the output terminal receives either a high or a low voltage level state for output to the load during a data cycle, the circuit comprising:
a sensing device connected to the output terminal for sensing the voltage level at the output terminal at the end of the data cycle; and
a driving device connected to said sensing device for driving the voltage level at the output terminal prior to the start of a subsequent data cycle only towards a substantially predetermined voltage level between the high and low voltage level states, and in only one direction of voltage change rate and from substantially only one of the high or low voltage level states, and based upon the voltage at the output terminal sensed by said sensing device.

15. The circuit of claim 14 wherein said sensing device includes a plurality of voltage detectors and said driving device includes a plurality of voltage drivers, each of said voltage drivers interconnected to one of said voltage detectors for driving the voltage level at the output terminal to said predetermined voltage.

16. The circuit of claim 15 and further including:
a controller for controlling said driving device for driving the voltage level at the output terminal to within a predetermined voltage range of a mid-voltage level midway between the high and the low voltage level states.

17. The circuit of claim 15 and further including:
a controller for controlling said driving device for controlling the rate at which the voltage level at the output terminal is driven towards said mid-voltage level.

18. The circuit of claim 17 wherein the rate is determined by the relative voltage difference between the actual voltage level at the output terminal and said mid-voltage level.

19. The circuit of claim 14 wherein said sensing device includes a plurality of voltage detectors and said driving device includes a voltage driver operating over a range of voltages for driving the voltage level at the output terminal to said predetermined voltage level based upon the voltage sensed by said voltage detectors.

20. A method for presetting the voltage of an output terminal connected to a load, where the output terminal receives either a high or low voltage level state for output to the load during a data cycle, comprising the steps of:
sensing the voltage level at the output terminal at the end of a data cycle and determining whether the voltage level is at a high or a low voltage level state;
driving the voltage level at the output terminal prior to the start of a subsequent data cycle to substantially a predetermined voltage between the high and low voltage levels and from substantially only one of the high or low voltage level states; and
inhibiting the step of driving the voltage level at the output terminal when the voltage level at the output terminal is substantially equal to the predetermined voltage.

21. The method of claim 20, wherein the step of driving the voltage level at the output terminal to substantially a predetermined voltage is operable to drive the voltage at the output terminal to a mid-voltage level midway between the high and low voltage states.

22. The method of claim 20, wherein the step of driving the voltage level at the output terminal comprises operating in a first mode and a second mode, said first and second modes mutually exclusive, operation in said first mode only increasing the voltage level at the output terminal to a mid-voltage level midway between the high and low voltage states, and operation in the second mode only decreasing the voltage level at the output terminal to a mid-voltage level midway between the high and low voltage states.

23. The method of claim 20, and further comprising the step of controlling the step of driving the voltage level at the output terminal toward the reference voltage to prevent driving of the voltage level at the output terminal to be greater than or less than a substantially mid-voltage level midway between the high and low voltage level states, with the reference voltage equal to the mid-voltage level.

24. The method of claim 20, wherein the step of driving the voltage at the output terminal to the predetermined voltage comprises driving the voltage level at the output terminal to within a predetermined voltage range of the reference voltage.

25. The method of claim 20, and further including controlling the rate at which the voltage level at the output terminal is driven towards the reference voltage.

26. The method of claim 25, and further comprising determining the rate by the relative voltage difference between the actual voltage level of the output terminal and the predetermined voltage level.

* * * * *

UNITED STATES PATENT AND TRADEMARK OFFICE
CERTIFICATE OF CORRECTION

PATENT NO. : 5,124,577
DATED : June 23, 1992
INVENTOR(S) : Harold L. Davis; Douglas P. Sheppard It is certified that error appears in the above-identified patent and that said Letters Patent is hereby corrected as shown below:

Column 2, line 47, replace "1o" with "10".

Column 4, line 2, replace "circuit 3" with -- circuit 36 --.

Signed and Sealed this

Ninth Day of November, 1993

Attest:

BRUCE LEHMAN

*Attesting Officer*     *Commissioner of Patents and Trademarks*